United States Patent
Takahashi (10) Patent No.: US 8,671,844 B2
(45) Date of Patent: Mar. 18, 2014

(54) RAILWAY VEHICULAR POWER CONVERTER

(71) Applicant: Fuji Electric Co., Ltd., Kawasaki (JP)

(72) Inventor: Kiyoshi Takahashi, Sagamihara (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/649,414

(22) Filed: Oct. 11, 2012

(65) Prior Publication Data

US 2013/0092045 A1   Apr. 18, 2013

(30) Foreign Application Priority Data

Oct. 18, 2011  (JP) .................................. 2011-228546

(51) Int. Cl.
   *B61C 17/00*   (2006.01)
(52) U.S. Cl.
   USPC .............. 105/26.05; 105/35; 105/49; 105/50
(58) Field of Classification Search
   USPC ............. 105/26.05, 35, 49, 50, 61, 73, 77, 76
   See application file for complete search history.

(56) References Cited

U.S. PATENT DOCUMENTS

| | | | |
|---|---|---|---|
| 5,253,613 A * | 10/1993 | Bailey et al. ................ 123/41.31 |
| 5,735,215 A * | 4/1998 | Tegeler ......................... 105/34.1 |
| 7,137,344 B2 * | 11/2006 | Kumar et al. .................. 105/35 |
| 7,185,591 B2 * | 3/2007 | Kumar et al. .................. 105/35 |
| 7,237,492 B2 * | 7/2007 | Inarida .............................. 105/35 |
| 7,325,498 B2 * | 2/2008 | Kumar et al. .................. 105/35 |
| 7,402,982 B2 * | 7/2008 | Ito et al. ........................ 320/150 |
| 7,571,683 B2 * | 8/2009 | Kumar ............................. 105/35 |
| 7,971,538 B1 * | 7/2011 | Miller et al. .................... 105/50 |
| 8,006,627 B1 * | 8/2011 | Miller et al. .................... 105/49 |
| 8,171,860 B1 * | 5/2012 | Miller et al. .................... 105/49 |
| 8,505,464 B2 * | 8/2013 | Huber et al. .................... 105/49 |
| 2002/0177929 A1 * | 11/2002 | Kumar ............................ 701/19 |
| 2004/0216636 A1 * | 11/2004 | Emori et al. ............... 105/26.05 |
| 2012/0228945 A1 * | 9/2012 | Abe et al. ........................ 307/77 |
| 2013/0016481 A1 * | 1/2013 | Takahashi ...................... 361/724 |
| 2013/0049365 A1 * | 2/2013 | Hatanaka ........................ 290/45 |
| 2013/0092045 A1 * | 4/2013 | Takahashi ...................... 105/49 |

FOREIGN PATENT DOCUMENTS

JP   2004-087711   3/2004

* cited by examiner

*Primary Examiner* — Jason C Smith
(74) *Attorney, Agent, or Firm* — Manabu Kanesaka

(57) ABSTRACT

A railway vehicular power converter adapted to be fixed beneath a floor of a railway vehicle has a power conversion unit, a housing, and a plurality of L-shaped securing members provided at upper end parts of an outer surface of the housing for fixing beneath the floor of the railway vehicle. The plurality of securing members is reinforced by reinforcing members provided inside the housing and attached behind the surface of the housing where the securing members are disposed. Each of the reinforcing members has a C-channel having a length substantially the same as a length of the housing in a shorter direction thereof, and has two edges in the shorter direction bent at least once.

10 Claims, 12 Drawing Sheets

RAILWAY VEHICULAR POWER CONVERTER

BACKGROUND OF THE INVENTION

1. Field of the Invention

The present invention relates to a railway vehicular power converter.

2. Description of the Related Art

A power converter is conventionally incorporated in the railway vehicle body of, for example, rolling stock. The power converter is equipped with an inverter and converter for converting an overhead wire power supplied from a pantograph into a predetermined AC power. A railway vehicle drive motor is controlled by this AC power (Japanese Patent Application Publication No. 2004-87711).

Such a conventional power converter is described with reference to FIGS. 11 and 12.

Figure 11:
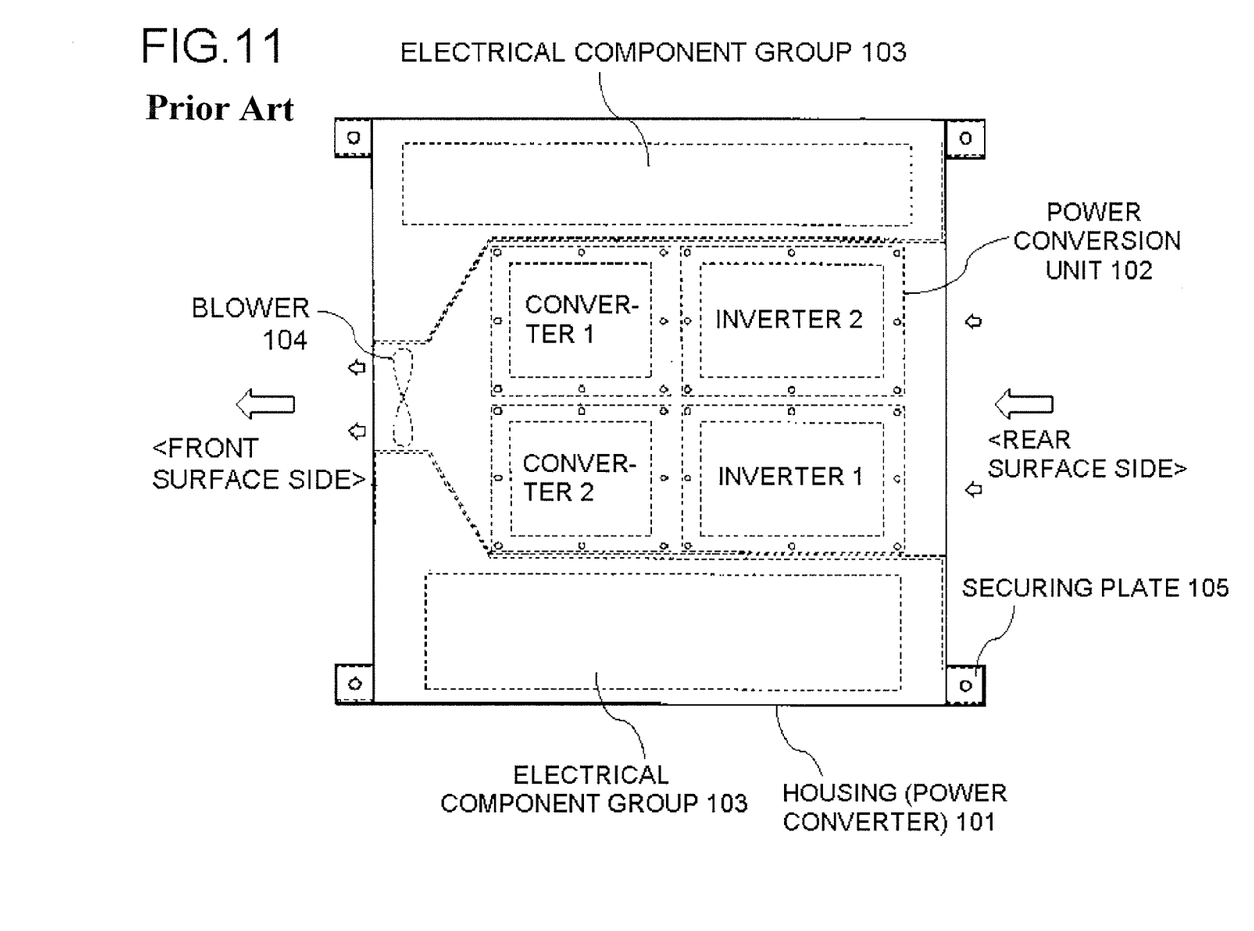
FIG. 11 is a planar cross-sectional view of a conventional vehicular power converter.

FIG. 11 is a planar cross-sectional view of the conventional power converter. Reference numeral 101 represents a housing (power converter), 102 a power conversion unit, 103 electrical component groups, 104 a blower, and 105 a securing plate.

The housing 101 is in the shape of a rectangular cuboid. The power conversion unit 102 configured by a converter and inverter is disposed in the vicinity of the center of the housing 101. The electrical component groups 103 are disposed at either side surface of the power conversion unit 102 so as to sandwich the power conversion unit 102. The blower 104 is installed at a front surface of the housing 101. The L-shaped securing plate 105 is welded to each of four corners of the housing 101.

Overhead wire power supplied from a pantograph is converted into a predetermined AC power by the power conversion unit 102. Because the power conversion unit 102 generates heat, outside air is introduced from the rear surface side of the housing 101 and released to the front surface side of the housing 101 by the blower 104 to cool the power conversion unit 102 with a forced draft of the air. As will be described hereinafter, the housing 101 is attached to a railway vehicle body by fastening the securing plate 105 by a bolt and the like.

Figure 12:
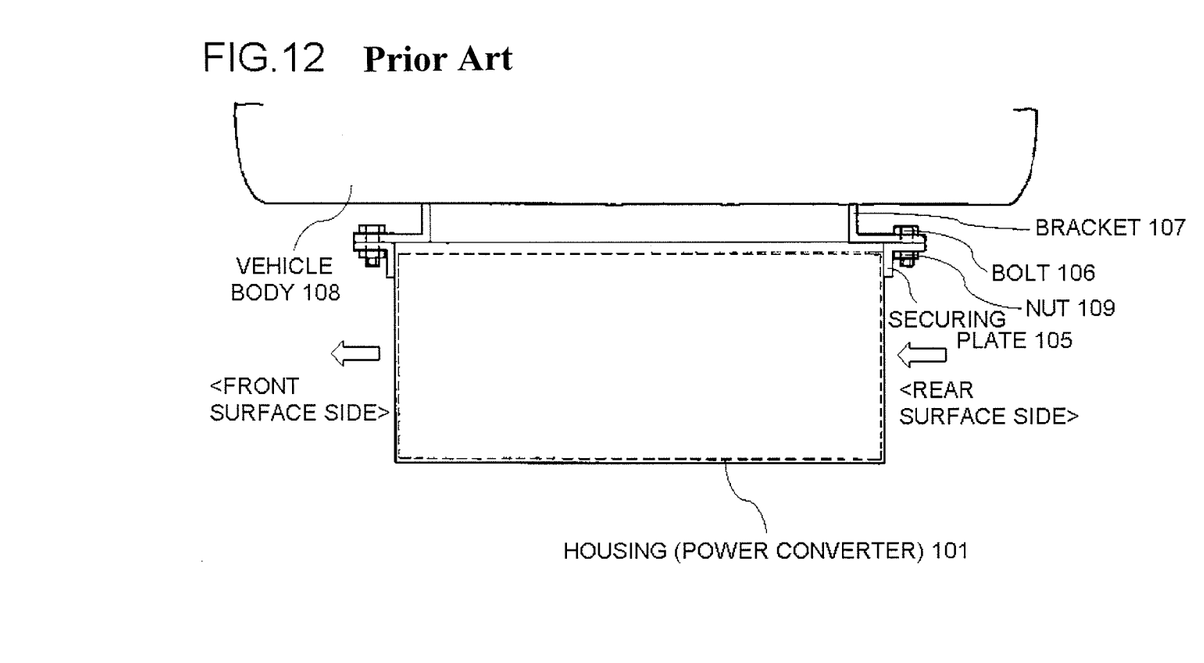
FIG. 12 is a side view of the conventional vehicular power converter.

FIG. 12 is a side view of the conventional power converter. In this diagram the housing (power converter) 101 is suspended from the railway vehicle body. Reference numeral 106 represents a bolt, 109 a nut, 107 a bracket, and 108 a railway vehicle body.

The L-shaped bracket 107 is provided at each of four sections under a floor of the railway vehicle body 108 so as to face the securing plate 105 of the housing 101. Each of the brackets 107 and the securing plate 105 are fastened and secured to each other by the bolt 106 and the nut 109. As a result, the housing 101 is suspended under the floor of the railway vehicle body 108.

The conventional vehicular power converter has the following problems.

Because the conventional vehicular power converter is subject to shock due to vibration, the housing (power converter) and the railway vehicle body need to be fixed to each other. However, the housing needs to be small due to the limited space under the floor of a railway vehicle for installing the housing. Moreover, the housing needs to be light due to requests for minimizing labor in maintaining and inspecting the power converter and for improving the workability of maintaining and inspecting the power converter.

However, in the conventional vehicular power converter, in order to increase the strength of a secured section between the housing and the railway vehicle body, a sheet metal for configuring the entire housing including the railway vehicle body and the securing part needs to be thickened, which increases the mass of the entire housing.

SUMMARY OF THE INVENTION

On the other hand, thinning the sheet metal of the housing for the purpose of reducing the mass of the housing lowers the strength of the secured section.

The present invention was conceived in view of the problems described above, and an object thereof is to improve the strength of the secured section between the railway vehicle body and the railway vehicular power converter.

In order to achieve the object described above, the present invention is a railway vehicular power converter having a housing capable of being fixed beneath a floor of a railway vehicle and having a storage space for storing a rectangular cuboid power conversion unit. The railway vehicular power converter has L-shaped first and second securing members provided respectively at upper end parts of outer front and outer rear surfaces of the housing and secured under the floor of the railway vehicle. The first securing member provided on the outer front surface of the housing is reinforced by a first reinforcing member provided inside the housing. The first reinforcing member is a C-channel having the same length as the length of the housing in a shorter direction thereof and attached to an inner upper end corner behind the front surface of the housing provided with the first securing member. The first securing member has two edges in the shorter direction bent at least once. The second securing member provided on the outer rear surface of the housing is reinforced by a second reinforcing member provided inside the housing. The second reinforcing member is a C-channel having the same length as the length of the housing in a shorter direction thereof and attached to an inner upper end corner behind the rear surface of the housing provided with the second securing member. The second securing member has two edges in the shorter direction bent at least once.

According to the present invention, in the above-described configuration, an L-shaped third securing member is provided at an upper end part of an outer side surface of the housing and is secured under the floor of the railway vehicle. The third securing member is reinforced by a third reinforcing member provided inside the housing. The third reinforcing member is a C-channel having the same length as the length of the housing in a longer direction thereof, and attached to an inner upper end corner behind the side surface of the housing provided with the third securing member. The third securing member has two edges in the longer direction bent at least once.

According to the present invention, in the above-described configuration, L-shaped third and fourth securing members are provided at upper end parts of outer side surfaces of the housing in which the side surfaces of the housing are facing each other, and are secured under the floor of the railway vehicle.

The third securing member provided on one of the side surfaces of the outer side surface of the housing is reinforced by a third reinforcing member provided inside the housing. The third reinforcing member is a C-channel having the same length as the length of the housing in a longer direction thereof and attached to an inner upper end corner behind the side surface of the housing provided with the third securing member. The third reinforcing member has two edges in the longer direction bent at least once.

The fourth securing member on the other side surface of the outer side surface of the housing is reinforced by a fourth reinforcing member provided inside the housing. The fourth reinforcing member is a C-channel having the same length as the length of the housing in a longer direction thereof, and attached to an inner upper end corner behind the side surface of the housing provided with the fourth securing member. The fourth reinforcing member has two edges in the longer direction bent at least once.

Moreover, in order to achieve the object described above, the present invention is a railway vehicular power converter having a housing to be secured beneath a floor of a railway vehicle and having a storage space for storing a rectangular cuboid power conversion unit. L-shaped first, second, and third securing members are provided respectively at upper end parts of an outer front surface, an outer rear surface, and an outer side surface of the housing and secured under the floor of the railway vehicle. The third securing member provided on the outer side surface of the housing is reinforced by a third reinforcing member provided inside the housing. The third reinforcing member is a C-channel having the same length as the length as the length of the housing in a longer direction thereof, and attached to an inner upper end corner behind the side surface of the housing provided with the third securing member. The third reinforcing member has two edges in the longer direction bent at least once.

In order to achieve the object described above, the present invention is a railway vehicular power converter having a housing to be secured under a floor of a railway vehicle and having a storage space for storing a rectangular cuboid power conversion unit. L-shaped third and fourth securing members are provided respectively at upper end parts of an outer side surface of the housing in which the side surfaces are facing each other, and are secured under the floor of the railway vehicle.

The third securing member provided on one of the side surfaces of the outer side surface of the housing is reinforced by a third reinforcing member provided inside the housing. The third reinforcing member is a C-channel having the same length as the length of the housing in a longer direction thereof, and attached to an inner upper end corner behind the side surface of the housing provided with the third securing member. The third reinforcing member has two edges in a longer direction bent at least once.

The fourth securing member provided on the other side surface of the outer side surface of the housing is reinforced by a fourth reinforcing member provided inside the housing. The fourth reinforcing member is a C-channel having the same length as the length of the housing in a longer direction thereof, and attached to an inner upper end corner behind the side surface of the housing provided with the fourth securing member. The fourth reinforcing member has two edges in the longer direction bent at least once.

According to the present invention, in the above-described configuration, the reinforcing members are bent into a hook shape.

Furthermore, according to the present invention, in the above-described configuration, the securing members and the reinforcing members have the same sheet thickness.

According to the present invention, in the above-described configuration, a drive motor is controlled by using the railway vehicular power converter having the configuration described above.

The present invention can realize improvement of the strength of the secured section between a railway vehicle body and the railway vehicular power converter.

DESCRIPTION OF THE PREFERRED EMBODIMENTS

Embodiments of the present invention are described hereinafter with reference to the drawings. The following description is merely illustrative, and therefore the present invention should not be limited thereto. In other words, a person skilled in the art can make many modifications within the technical idea of the present invention.

First of all, an entire configuration of a rolling stock to which first to third embodiments of the present invention are applied is described with reference to FIG. 1.

Figure 1:
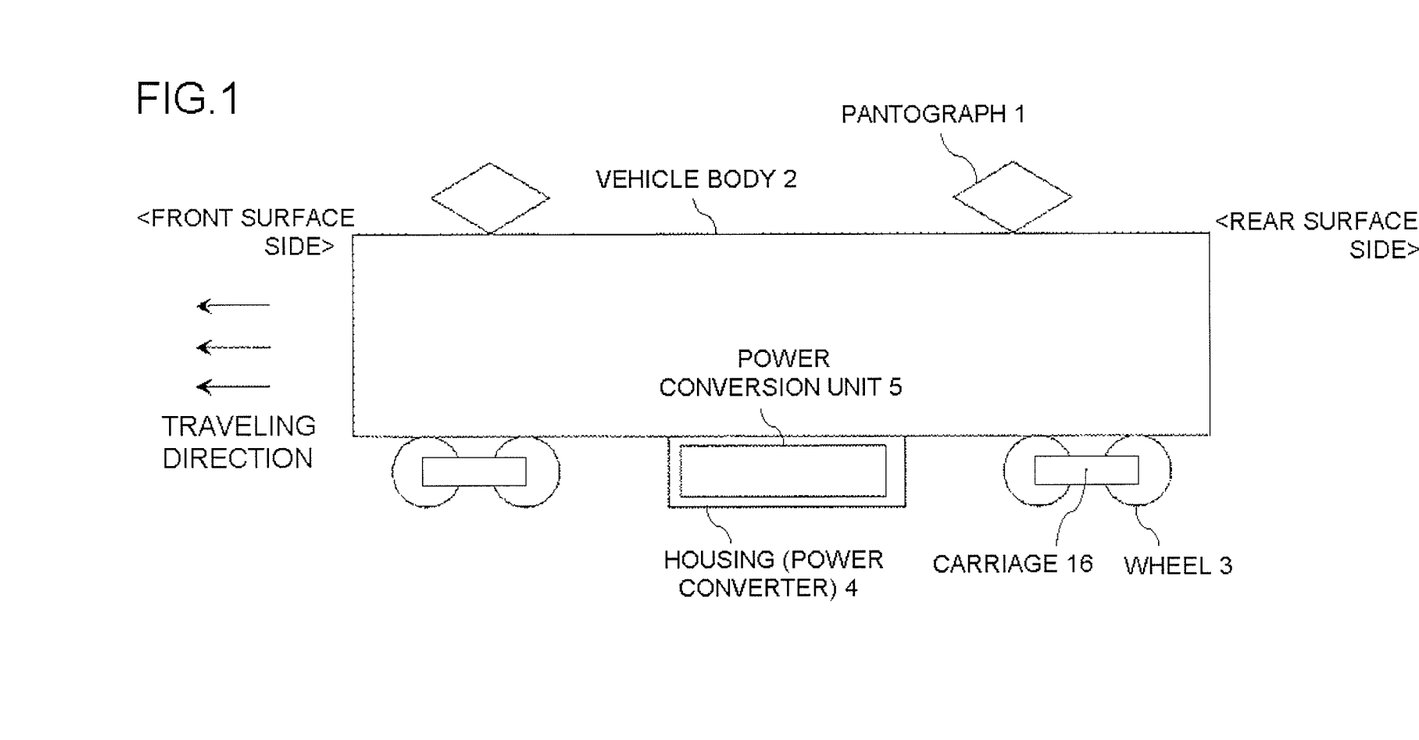
FIG. 1 is a configuration diagram of an entire rolling stock to which first to third embodiments of the present invention are applied.

FIG. 1 is a configuration diagram of an entire rolling stock. Reference numeral 1 represents pantographs, 2 a railway vehicle body, 3 wheels, 4 a housing (power converter), 5 a power conversion unit, and 16 carriages.

As shown in FIG. 1, an ordinary rolling stock has the pantograph 1 installed at an upper part of the railway vehicle body 2. Each carriage 16 formed on the continuous wheels 3 is provided under a floor of the railway vehicle body 2 to support the railway vehicle body 2. The housing 4 is installed between the carriages 16 provided under the floor of the railway vehicle body 2. The housing 4 is suspended under the floor of the railway vehicle body 2. The power conversion unit 5 configured by an inverter, converter and the like is stored in the housing 4.

Here, a traveling direction of the railway vehicle body 2 is illustrated as a front surface side of the railway vehicle body 2, and a direction opposite to the traveling direction is illustrated as a rear surface side of the railway vehicle body 2.

Next are described the operations of the rolling stock of FIG. 1 driven by a DC motor.

First, the power conversion unit 5 receives DC power from the pantograph 1. Then, the DC current is converted into AC power by switching a semiconductor element (not shown)

provided inside the power conversion unit 5. The AC power obtained as a result of the conversion drives a railway vehicle drive motor (not shown) to rotate the wheels 3, allowing the rolling stock to start traveling.

These are the entire configuration and the operations of the rolling stock.

Figure 3:
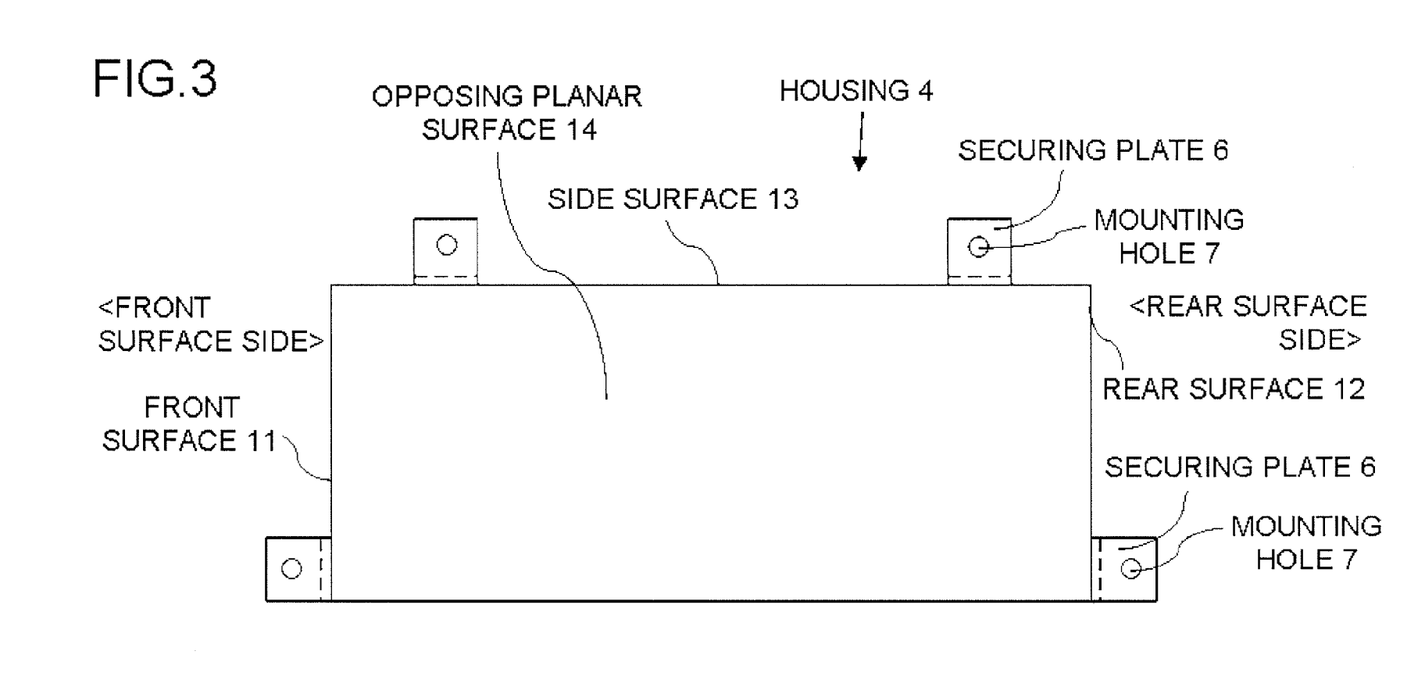
FIG. 3 is a plan view of the exterior of the railway vehicular power converter according to the first embodiment of the present invention.
Figure 4:
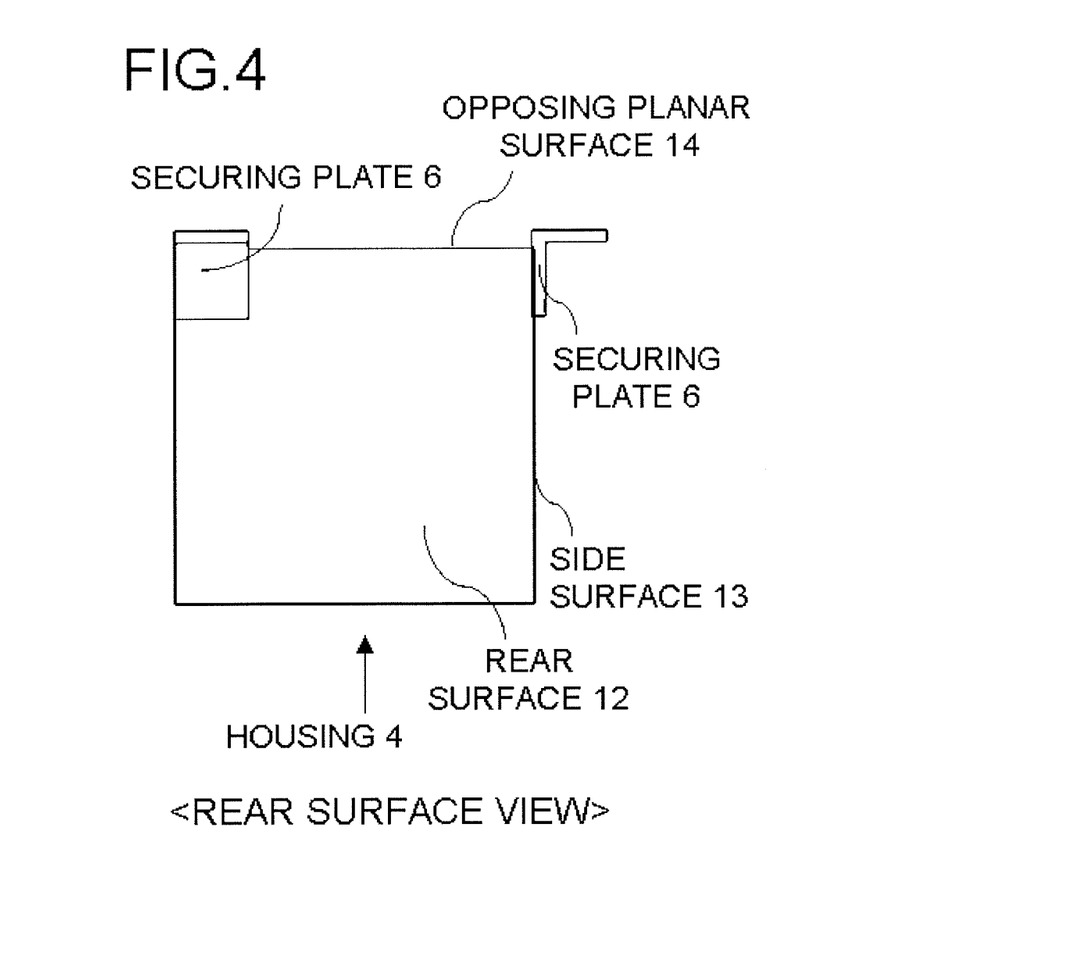
FIG. 4 is a rear view of the exterior of the railway vehicular power converter according to the first embodiment of the present invention.

Next, exteriors of the railway vehicular power converter according to the first embodiment are described with reference to FIGS. 2 to 4.

Figure 2:
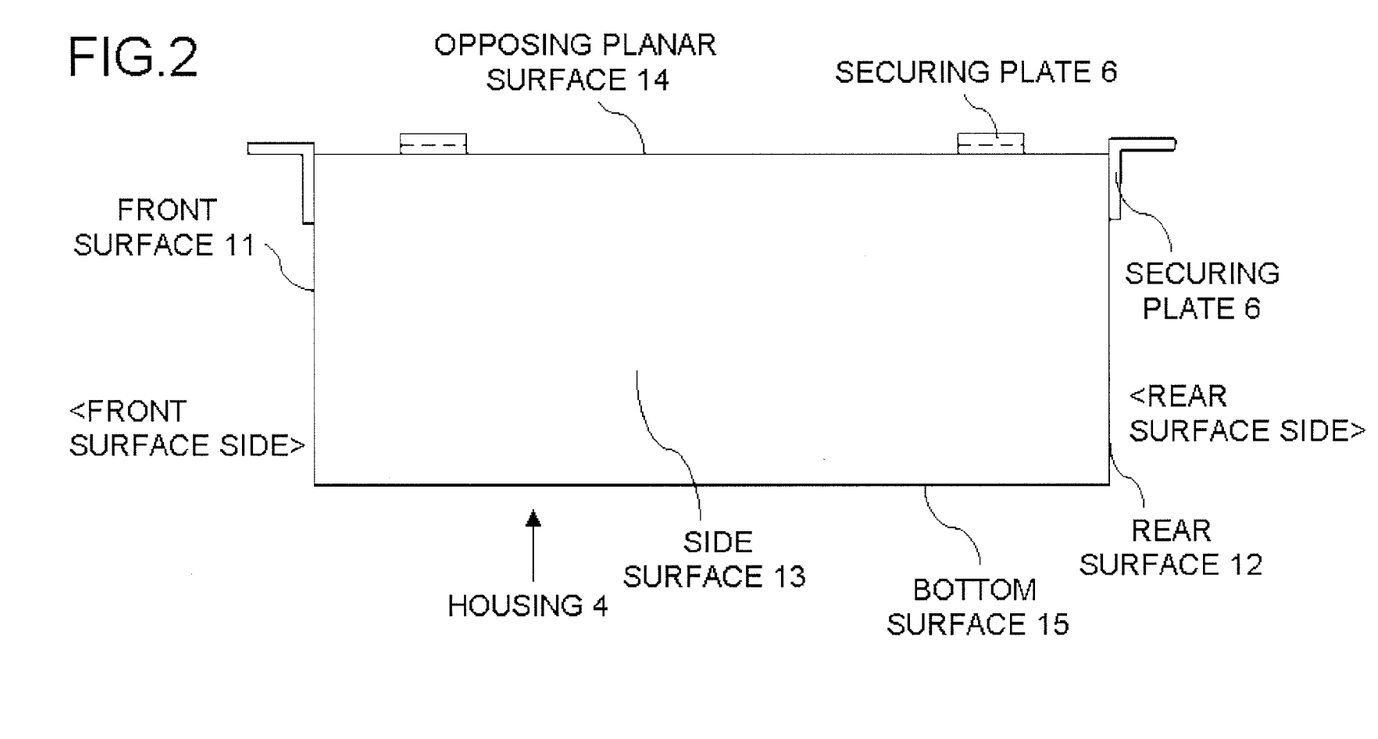
FIG. 2 is a side view of an exterior of a railway vehicular power converter according to the first embodiment of the present invention.

FIG. 2 is a side view of an exterior of the railway vehicular power converter according to the first embodiment of the present invention. FIG. 3 is a plan view of the same. FIG. 4 is a rear view of the same. Reference numeral 6 represents securing plates (securing members), 7 mounting holes, 11 a front surface, 12 a rear surface, 13 side surfaces, 14 an opposing planar surface, and 15 a bottom surface.

As shown in FIG. 1, once the rectangular cuboid housing 4 is suspended and secured under the floor of the railway vehicle body 2, the opposing planar surface 14 of the housing 4 faces a floor surface of the railway vehicle body 2.

A front surface-side upper end part and rear surface-side upper end part of the housing 4 are installed with the securing plates 6 respectively. Further, two securing plates 6 are installed at a predetermined interval in an upper end part of one of the side surfaces 13 of the housing 4. Each of the securing plates 6 is in the form of a plate (L-shaped) and has the mounting hole 7 formed at the center thereof in order to pass a bolt (not shown) therethrough. The securing plates 6 are attached to the housing 4 by, for example, welding or rivets.

The power converter is secured to the railway vehicle body 2 by a total of four securing plates 6. Specifically, the bolts (not shown) are inserted into the mounting holes 7 formed in the securing plates 6 and fastened with nuts (not shown). In this manner, the power converter is secured under the floor of the railway vehicle body 2, in a suspended manner.

Next, a reinforcing member 8 that is applied inside the housing 4 of the railway vehicular power converter of the first embodiment of the present invention is described with reference to FIG. 5.

Figure 5:
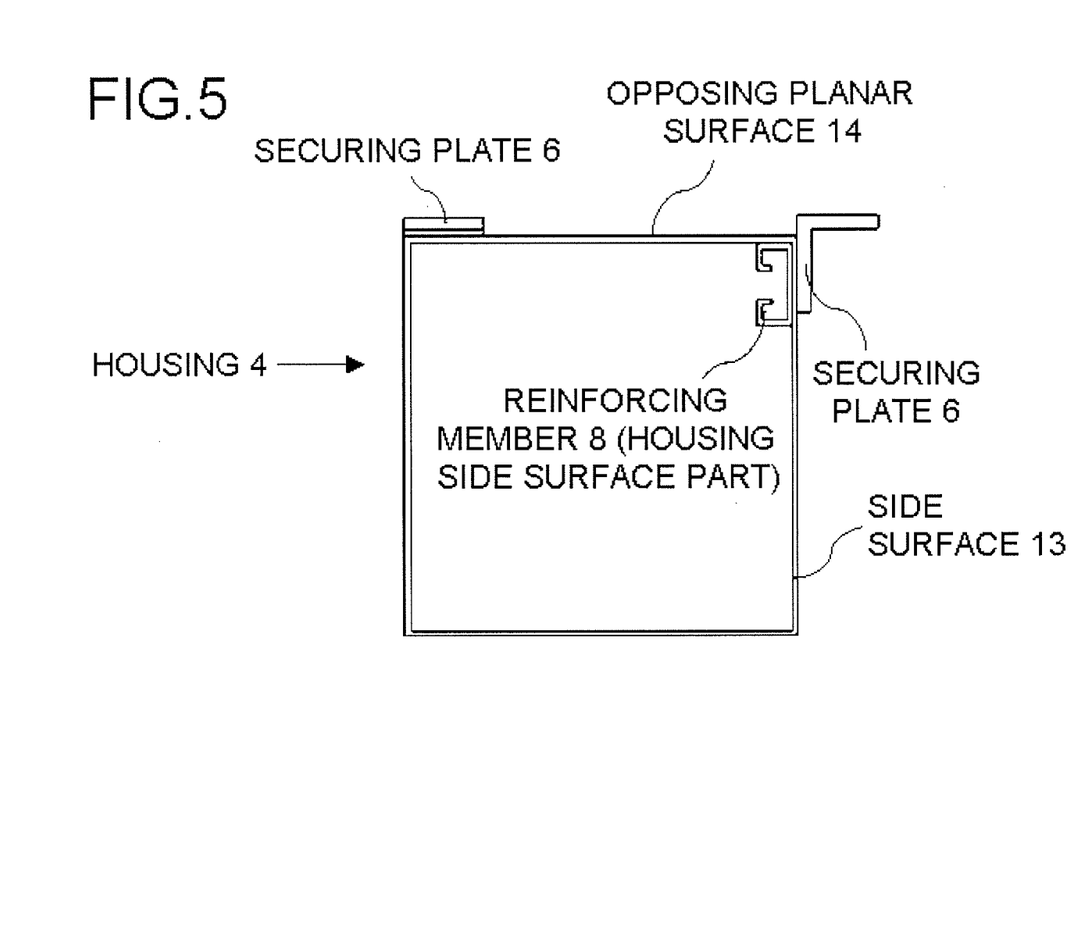
FIG. 5 is a cross-sectional view showing a rear surface side of the railway vehicular power converter according to the first embodiment of the present invention.

FIG. 5 is a cross-sectional view showing the rear surface side of the railway vehicular power converter according to the first embodiment of the present invention. Reference numeral 8 represents a reinforcing member.

As shown in FIG. 5, the C-channel-shaped reinforcing member 8 is installed at an upper end part on the inner side surface 13 of the housing 4. The securing plates 6 are positioned on the outer side surface 13 of the housing 4.

Edges on the either side of the reinforcing member 8 in a longer direction are bent (twice) as will be described hereinafter. Note that the reinforcing member 8 is attached to an inner surface of the housing 4 by, for example, welding or rivets.

The configuration of this reinforcing member 8 is described in further detail with reference to FIGS. 6 and 7.

Figure 6:
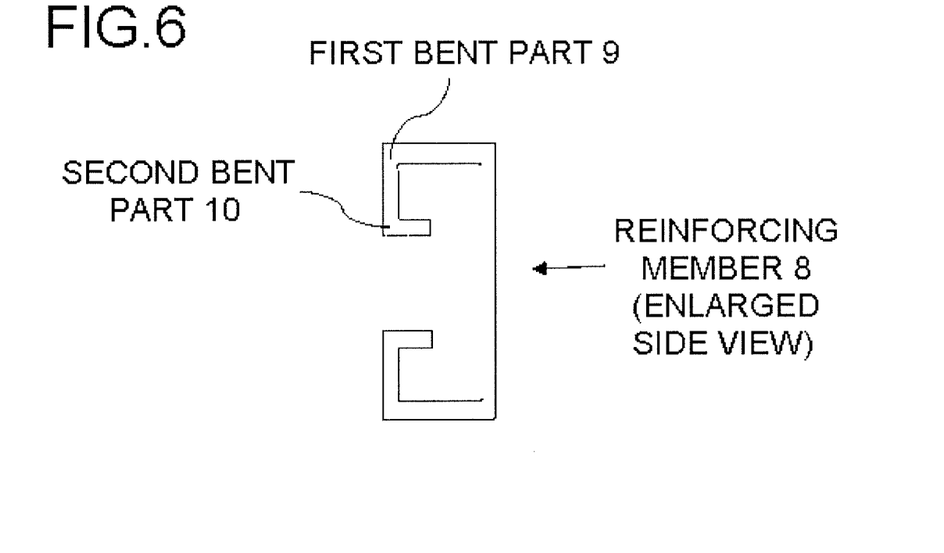
FIG. 6 is an enlarged side view of a reinforcing member of the railway vehicular power converter according to the first embodiment of the present invention.

FIG. 6 is an enlarged side view of the reinforcing member of the railway vehicular power converter according to the first embodiment of the present invention. FIG. 7 is a front view of the reinforcing member. Reference numeral 9 is a first bent part and 10 a second bent part.

As shown in FIG. 6, the first bent part 9 and the second bent part 10 are formed at either end parts of the reinforcing member 8. In other words, these end parts of the reinforcing member 8 are bent into a hook shape. Examples of the bending method include a roll forming method and press brake method.

Figure 7:
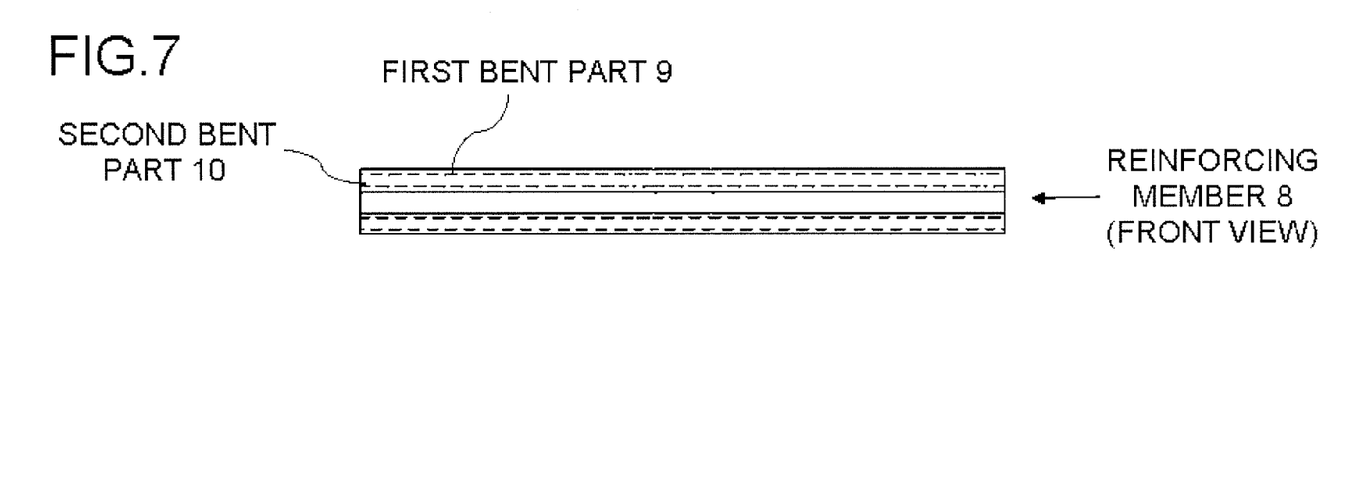
FIG. 7 is a front view of the reinforcing member of the railway vehicular power converter according to the first embodiment of the present invention.

As shown in FIG. 7, the total length of the reinforcing member 8 is set at a length equivalent to the total horizontal length of a side surface part of the housing 4. Therefore, when attaching the reinforcing member 8 to the inner surface of the housing 4 as shown in FIG. 5, the reinforcing member 8 can be installed along the side surface part of the housing 4. Note that the sheet thickness of the reinforcing member 8 is substantially the same as that of the housing 4.

In the above-described vehicular power converter of the first embodiment of the present invention, the strength of securing the housing 4 to the railway vehicle body 2 can be improved by installing the reinforcing member 8 on the inside of the side surface part of the housing 4 where the securing plates 6 for securing the housing 4 to the railway vehicle body 2 are installed.

Because the reinforcing member 8 is bent twice, the strength of securing the housing 4 to the railway vehicle body 2 can be improved without increasing the sheet thicknesses of the housing 4 and the securing plates 6.

Accordingly, the strength of securing the housing 4 to the railway vehicle body 2 can be improved, while reducing the size and weight of the housing 4.

A second embodiment of the present invention is described next. The sections same as those of the first embodiment are simplified, and the sections different from those of the first embodiment are described in detail.

The exterior of the housing 4 of the second embodiment is identical to that of the first embodiment. The internal structure of the housing 4 is different from that of the first embodiment and is therefore described with reference to FIG. 8.

Figure 8:
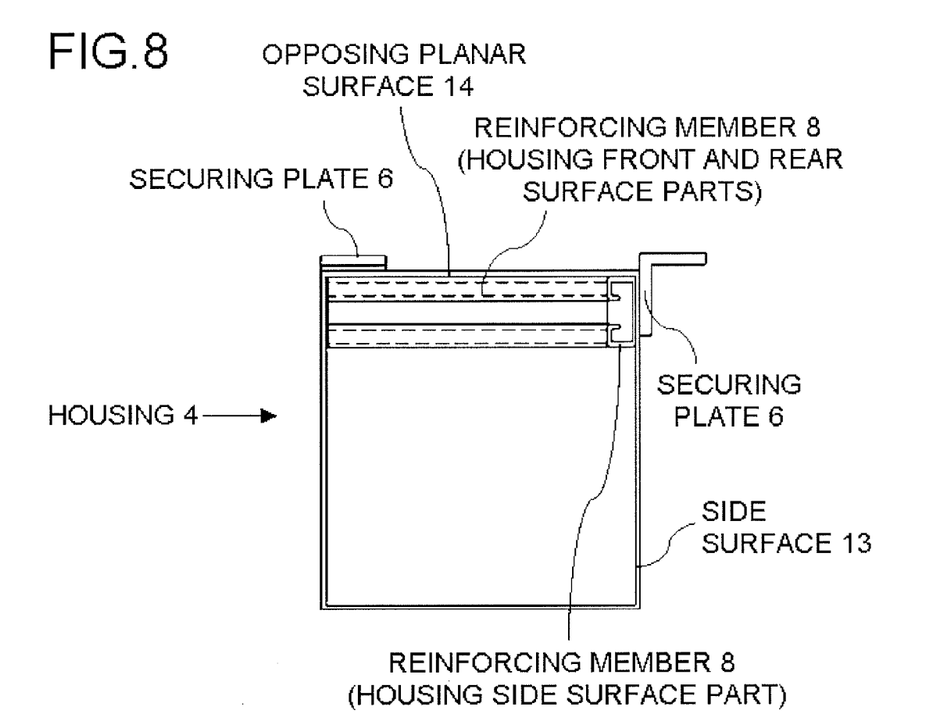
FIG. 8 is a cross-sectional view showing a rear surface side of a railway vehicular power converter according to a second embodiment of the present invention.

FIG. 8 is a cross-sectional view showing the rear surface side of the railway vehicular power converter according to the second embodiment of the present invention.

As shown in FIG. 8, a C-channel-shaped reinforcing member 8 is installed inside the housing 4 along an upper end of the side surface part of the housing 4. The reinforcing member 8 is also installed at each of upper ends of front and rear surface parts of the housing 4, along the lengths of these upper ends. As with the first embodiment, the first bent part 9 and the second bent part 10 are formed at either end part of the reinforcing member 8.

Next, the reinforcing members 8 installed at the front and rear surface parts of the housing 4 are described with reference to FIG. 9.

Figure 9:
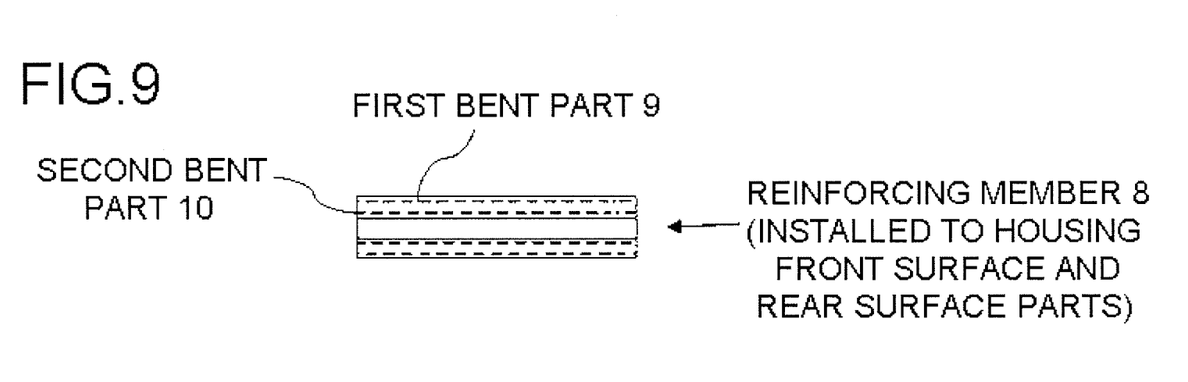
FIG. 9 is a front view of a reinforcing member of the railway vehicular power converter according to the second embodiment of the present invention.

FIG. 9 is a front view of the reinforcing member of the railway vehicular power converter according to the second embodiment of the present invention.

As shown in FIG. 9, the total length of each reinforcing member 8 is set at a length equivalent to those of the front and rear surface parts of the housing 4. As a result, when attaching the reinforcing member 8 on the inner surfaces of the housing 4 as shown in FIG. 8, not only it is possible to install the reinforcing members 8 along the side surface part of the housing 4, but also the reinforcing members 8 can be installed along the front and rear surface parts of the housing 4. The sheet thickness of each reinforcing member 8 is substantially the same as that of the housing 4.

In this manner, in the railway vehicular power converter according to the second embodiment of the present invention, the reinforcing member 8 is provided inside the side surface part of the housing 4 where the securing plate 6 for securing the housing 4 to the railway vehicle body 2 is installed, and the reinforcing members 8 are also provided on the inside the securing plates located in the front and rear surface parts of the housing 4. This leads to an increase in the area of reinforcement, further improving the strength of securing the housing 4 to the railway vehicle body 2.

Because each of the reinforcing members 8 is bent twice, the strength of securing the housing 4 to the railway vehicle body 2 can be further improved without increasing the sheet thicknesses of the housing 4 and the securing plates 6.

Accordingly, the strength of securing the housing 4 to the railway vehicle body 2 can be further improved, while reducing the size and weight of the housing 4.

Finally, a third embodiment of the present invention is described. The sections same as those of the first and second embodiments are simplified, and the sections different from those of the first and second embodiments are described in detail.

The exterior of the housing 4 of the third embodiment is identical to those of the first and second embodiments. The internal structure of the housing 4 is different from those of the first and second embodiments and is therefore described with reference to FIG. 10.

Figure 10:
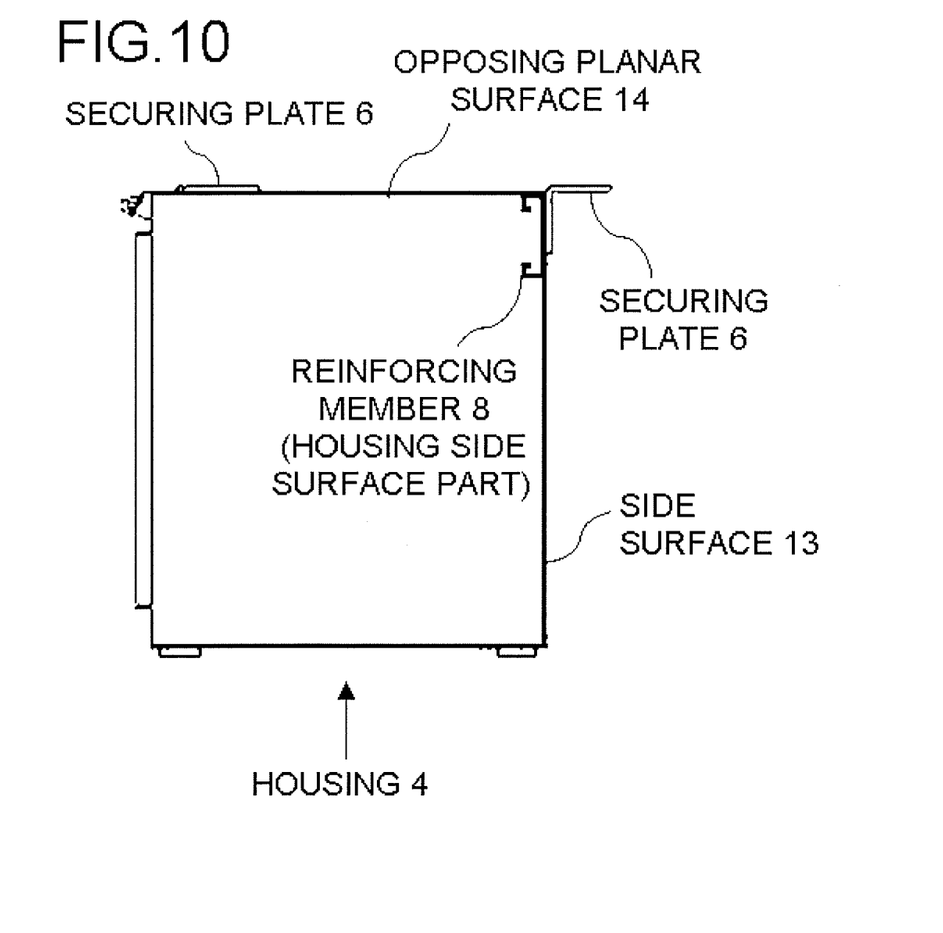
FIG. 10 is a cross-sectional view showing a rear surface side of a railway vehicular power converter according to a third embodiment of the present invention.

FIG. 10 is a cross-sectional view showing the rear surface side of the railway vehicular power converter according to the third embodiment of the present invention.

As with the first embodiment, the C-channel-shaped reinforcing member 8 is installed inside the housing 4 along the upper end of the side surface part of the housing 4. However, thin sheet plates each having a sheet thickness of equal to or less than half the sheet thickness of each of the housing 4, securing plates 6, and reinforcing member 8 of the first embodiment are used as the sheet plates of the housing 4, securing plates 6, and reinforcing member 8 of the third embodiment. The securing plates 6 and the reinforcing member 8 can be substantially the same in sheet thickness. The reinforcing member 8 is attached to the inner surface of the housing 4 by, for example, welding or rivets.

In the railway vehicular power converter according to the third embodiment of the present invention, even though the thin sheet plates are used as the sheet plates of the housing 4 and the securing plates 6, the use of the thin reinforcing member 8 on the inside of the housing 4 installed with the securing plates 6 can improve the strength of securing the housing 4 to the railway vehicle body 2.

Because the reinforcing member 8 is bent twice, the strength of securing the housing 4 to the railway vehicle body 2 can be improved, without causing the sheet thicknesses of the housing 4 and the securing plates 6 to be greater.

Accordingly, the strength of securing the housing 4 to the railway vehicle body 2 can be improved, while reducing the size and weight of the housing 4.

Note that, in the first to third embodiments described above, the reinforcing member 8 is bent twice to form the first bent part 9 and the second bent part 10. However, the number of bending is not limited to two: thus, the same effects can be achieved by bending the reinforcing member 8 once, three times or more often.

When bending the reinforcing member 8 once, the strength of securing the housing 4 to the railway vehicle body 2 can be improved with such a simple bending operation. Bending the reinforcing member 8 three times or more often can further improve the strength of securing the housing 4 to the railway vehicle body 2.

In addition, the reinforcing member 8 is installed at the side surface part of the housing 4 in the first to third embodiments described above. However, the side surface part does not have to be the only place for installing the reinforcing member 8. In other words, the reinforcing member 8 may not be installed at the side surface part of the housing 4 but at each of the front and rear surface parts or at only either one of the front or rear surface part. In such a case, the strength of securing the housing 4 to the railway vehicle body 2 can be improved with a simple installation operation of the reinforcing member 8.

Moreover, in the third embodiment the reinforcing member is installed at the side surface part of the housing 4. However, the side surface part does not have to be the only place for installing the reinforcing member 8. In other words, the reinforcing member 8 can be installed at each of the front and rear surface parts of the housing 4. In this case, the strength of securing the housing 4 to the railway vehicle body 2 can be further improved.

In the first to third embodiments described above, the securing plates 6 and the reinforcing member 8 are provided at the outer side surface 13, the front surface 11, and the rear surface 12 of the housing 4. However, these are not necessarily the only places for installing the securing plates 6 and the reinforcing member 8. In other words, the securing plates 6 and the reinforcing member 8 can be installed at the side surfaces facing the outer side surface 13 of the housing 4. As a result, the strength of securing the housing 4 to the railway vehicle body 2 can be further improved.

The housing 4 can be secured to the floor surface of the railway vehicle body 2 by installing the securing plates 6 and the reinforcing member 8 at only the outer side surface 13 of the housing 4 and the side surfaces facing the outer side surface 13 (in other words, the securing plates 6 and the reinforcing member 8 are not installed on the front surface 11 and the rear surface 12).

Similarly, the housing 4 can be secured to the floor surface of the railway vehicle body 2 by installing the securing plates 6 and the reinforcing member 8 only to the outer front surface 11 and the rear surface 12 of the housing 4 (in other words, the securing plates 6 and the reinforcing member 8 are not installed on the outer side surface 13 or the opposing side surfaces).

The disclosure of Japanese patent application No. 2011-228546 is incorporated herein as a reference.

What is claimed is:

1. A railway vehicular power converter adapted to be fixed beneath a floor of a railway vehicle, comprising:
    a housing having a storage space adapted to store a power conversion unit therein;
    L-shaped first and second securing members provided at upper end parts of an outer front surface and an outer rear surface of the housing respectively, and adapted to be fixed beneath the floor of the railway vehicle;
    a first reinforcing member provided inside the housing at a front upper end corner where the first securing member is attached, to reinforce the first securing member from an inside of the housing; and
    a second reinforcing member provided inside the housing at a rear upper end corner where the second securing member is attached, to reinforce the second securing member from the inside of the housing,
    wherein each of the first and second reinforcing members has a C-channel having a length substantially same as that of the housing in a shorter direction thereof, and has two edges in the shorter direction bent at least once.

2. A railway vehicular power converter according to claim 1, further comprising:
    an L-shaped third securing member provided at an upper end part of an outer side surface of the housing and adapted to be fixed beneath the floor of the railway vehicle, and
    a third reinforcing member provided inside the housing at an upper side end corner where the third securing member is provided, to reinforce the third securing member from the inside of the housing, wherein the third reinforcing member has a C-channel having a length substantially same as that of the housing in a long direction thereof, and has two edges bent in the longer direction at least once.

3. A railway vehicular power converter according to claim 1, further comprising:
- L-shaped third and fourth securing members provided at upper end parts of outer side surfaces of the housing facing each other, and adapted to be fixed beneath the floor of the railway vehicle;
- a third reinforcing member provided inside the housing at an upper side end corner where the third securing member is provided, to reinforce the third securing member from the inside of the housing;
- a fourth reinforcing member provided inside the housing at an upper side end corner where the fourth securing member is provided, to reinforce the fourth securing member from the inside of the housing,
- wherein each of the third and fourth reinforcing members has a C-channel having a length substantially same as that of the housing in a longer direction thereof, and has two edges bent in the longer direction at least once.

4. A railway vehicular power converter according to claim 1, wherein each of the reinforcing members is bent into a hook shape.

5. A railway vehicular power converter according to claim 4, wherein the securing members and the reinforcing members have same sheet thickness.

6. A rolling stock, comprising a drive motor controlled by the railway vehicular power converter according to claim 5.

7. A railway vehicular power converter according to claim 1, wherein the securing members and the reinforcing members have same sheet thickness.

8. A rolling stock, comprising a drive motor controlled by the railway vehicular power converter according to claim 7.

9. A railway vehicular power converter adapted to be fixed beneath a floor of a railway vehicle, comprising:
- a housing having a storage space adapted to store a power conversion unit;
- L-shaped first, second, and third securing members provided respectively at upper end parts of an outer front surface, an outer rear surface, and an outer side surface of the housing, and adapted to be fixed beneath the floor of the railway vehicle, the third securing member being provided at a side outer surface of the housing; and
- a third reinforcing member provided inside the housing at a side upper end corner of the housing where the third securing member is disposed, to reinforce the third securing member from the inside of the housing,
- wherein the third reinforcing member has a C-channel having a length substantially same as that of the housing in a longer direction thereof, and has two edges in the longer direction bent at least once.

10. A railway vehicular power converter adapted to be fixed beneath a floor of a railway vehicle, comprising:
- a housing having a storage space adapted to store a power conversion unit;
- L-shaped first and second securing members provided at upper end parts of outer side surfaces of the housing facing each other, and adapted to be fixed beneath the floor of the railway vehicle;
- a first reinforcing member provided inside the housing at a side upper end corner of the housing where the first securing member is attached, to reinforce the first securing member from an inside of the housing, and
- a second reinforcing member provided inside the housing at a side upper end corner where the second securing member is attached, to reinforce the second securing member from the inside of the housing,
- wherein each of the first and second reinforcing members has a C-channel having a length substantially same as that of the housing in a longer direction thereof, and has two edges in the longer direction bent at least once.

* * * * *